United States Patent [19]

Widmer

[11] Patent Number: 5,784,387

[45] Date of Patent: Jul. 21, 1998

[54] METHOD FOR DETECTING START-OF-FRAME, END OF FRAME AND IDLE WORDS IN A DATA STREAM

[75] Inventor: Albert X. Widmer, Katonah, N.Y.

[73] Assignee: International Business Machines Corporation, Armonk, N.Y.

[21] Appl. No.: 332,327

[22] Filed: Oct. 31, 1994

[51] Int. Cl.$^6$ .................................................. H03M 13/00
[52] U.S. Cl. ........................................................ 371/37.1
[58] Field of Search .............................. 371/37.1, 39.1, 371/37.2, 38.1; 341/58–60, 93, 94, 82, 102; 370/85.15, 110.1; 375/365

[56] References Cited

U.S. PATENT DOCUMENTS

| | | | |
|---|---|---|---|
| 4,241,446 | 12/1980 | Trubisky | 371/37.1 |
| 4,482,999 | 11/1984 | Janson et al. | 370/85.5 |
| 4,486,739 | 12/1984 | Franaszek et al. | 341/59 |
| 4,665,517 | 5/1987 | Widmer | 370/452 |
| 4,719,624 | 1/1988 | Bellisio | 370/105.1 |
| 4,855,742 | 8/1989 | Verboom | 341/102 |
| 4,856,003 | 8/1989 | Weng | 371/37.1 |
| 5,025,256 | 6/1991 | Stevens | 341/59 |
| 5,048,062 | 9/1991 | Gregg et al. | 375/365 |
| 5,144,304 | 9/1992 | McMahon et al. | 341/58 |

FOREIGN PATENT DOCUMENTS 62-79530  4/1987  Japan .

OTHER PUBLICATIONS

Martin W. Saches. Fiber Channel Standard. IBM Research Report, RC 18365, Yorktown Heights, NY. Sep. 1992.

X3T9 Technical Committee. Fibre Channel, Physical and Signaling Interface(FC–PH); Rev. 3.0. FC–P/92–001R3.0. American National Standards Institute, 1430 Broadway, New York, NY 10018, 1992. Available from: Global Engineering, 2805 McGraw St., Irvine, CA 92714.

Wayne D. Grover. Forward Error Correction in Dispersion–Limited Lightware Systems. IEEE Journal of Lightwave Technology, 6(5):643–654, May 1988.

C. Benz, M. Gowan and K. Springer. An Error Correcting Encoder and Decoder for a 1 Gbit/s Fiber Optic Link. Proc. IEEE 1991 Custom Integrated Circuits Conference, 7.1.1–7.1.4, San Diego, May 1991.

(List continued on next page.)

*Primary Examiner*—Reba I. Elmore
*Assistant Examiner*—Emmanuel L. Moise
*Attorney, Agent, or Firm*—Daniel P. Morris

[57] ABSTRACT

The present invention is directed to a method for determining whether a current word in a stream of words having a plurality of frames is an idle word, an end-of-frame word, a start-of-frame word of one of the plurality of frames of words wherein an error can occur in the stream of words. The current word contains four bytes. One of the plurality of frames of words starts with a start-of-frame word and ends with an end-of-frame word. One of the plurality of frames of words is followed by a modified idle word. Between each of the plurality of frames of words there is at least one idle word. Each of the end-of-frame word, the start-of-frame word, the modified-idle word and the idle word has four bytes. The method contains the following steps: determining if the current word is an idle word. The current word is assumed to be an idle word if three of the four bytes of the current word match three of the four bytes of the idle word and if it is followed by the start-of-frame words. If the current word is not an idle word, determining if the current word is a start-of-frame words. If the current word is not an idle word, determining if the current word is a start-of-frame word. The current word is assumed to be a start-of-frame word if three of the four bytes of the current word match three of the bytes of the start-of-frame word and if a word preceding the current word is an idle word. If the current word is not a start-of-frame word, determining if the current word is an end-of-frame word. The current word is assumed to be an end-of-frame word if either all of the four bytes of the current word match the four bytes of the end-of-frame word and at least one byte of a next word following the current word match the four bytes of the modified-idle word, or if at least three of the four bytes of the current word match the four bytes of the end-of-frame word and at least two bytes of the next word matches two bytes of the modified idle word.

1 Claim, 4 Drawing Sheets

OTHER PUBLICATIONS

D.H. McMahon, A.A. Kirby, B.A. Schofield and K. Springer. U.S. Pat. No. 5,144,304. Data and Forward error Control Coding Techniques for Digital Signals. Sep. 1, 1992.

K. Springer. A Forward Error Correcting Code for Gigabit Fiber Optic Links. Proc. SPIE —Int. Soc. Opt. Eng. (USA), 1577 High–Speed Fiber Networks and Channels (1991):L246–253, Boston, Sep. 1992.

C.A. French. Distance Preserving Run–Length Limited Codes. IEEE Transactions on Magnetics, MAG–25(5):4093–4095, Sep. 1989.

M. Blaum. Combining ECC with modulation: performance comparisons. IEEE Transactions on Information Theory, 37(3):945–949, May 1991.

M. Blaum, S. Litsyn, V. Buskens and C.A. van Tilborg. Error–Correcting Codes with Bounded Running Digital Sum. IEEE Transactions on Information Theory, 39(1):216–227, Jan. 1993.

C.S. Coetzee, H.C. Ferreira and P.G.W. van Rooyen. On the Performance and Implementation of a Class of Error and Erasure Control (d,k) Block Codes. IEEE Transactions on Magnetics, 26(5):2312–2314, Sep. 1990.

R.W. Hamming. Coding and Information Theory, 2nd Ed. Prentice Hall Inc., Englewood Cliffs, NJ 07632, 1986.

G.N.N. Martin. A Rate 8/10 DC Balanced Code with Local Parity. IBM Technical Disclosure Bulletin, 27(9):5272–5279, Feb. 1985.

A.X. Widmer. The ANSI Fibre Channel Transmission Code. IBM Research Report, RC Yorktown Heights, NY, Apr. 1993.

METHOD FOR DETECTING START-OF-FRAME, END OF FRAME AND IDLE WORDS IN A DATA STREAM

FIELD OF THE INVENTION

The present invention is directed to a method for determining whether a current word in a stream of words of a series of frames of words is an idle word, an end-of-frame word, or a start-of-frame word in a transmission of digital data.

BACKGROUND OF THE INVENTION

The primary purpose of transmission codes is to transform the frequency spectrum of a serial data stream so that clocking can be recovered readily and AC coupling is possible. The code must also provide special characters outside the data alphabet for functions such as character synchronization, frame delimiters and perhaps for abort, reset, idle, diagnostics, etc. Codes are also used, often in combination with signal waveform shaping, to adapt the signal spectrum more closely to specific channel requirements. In most cases, a reduction in bandwidth by constraints on both the high and the low frequency components is desirable to reduce distortion in the transmission media, especially electromagnetic cables, or in the band limited receiver, and to reduce the effects of extrinsic and intrinsic noise.

Another aspect of codes is their interaction with noise and errors in the line digits. The redundancy associated with line codes can be used to supplement other error detection mechanisms or to monitor the quality of the channel with a minimal amount of circuitry.

Such codes generally exhibit the undesirable feature of enlarging error bursts in the decoded data, making error detection by a cyclic redundancy check more difficult. A good transmission code should minimize these effects.

For fiber optic links and intra-establishment wire links, interest centers for many reasons on the family of two-level codes. For wire links, one prefers codes with no DC and little low frequency content in order to DC isolate the transmission line from the driver and receiver circuitry, by transformers or capacitors, and to reduce signal distortion on the line. Although these factors do not apply to the fiber optic case, good low frequency characteristics of the code are helpful for a number of reasons.

During discussion of coding issues for the ANSI Fibre Channel [Sachs, 1994] by a Task Group X3T9.3 of the Technical Committee [1992] on Device Level Interfaces, a significant minority felt that the physical link should provide Forward Error Correction (FEC). Four different reasons for these requests have been advanced:

The effective error rate should be less than $10^{-15}$, perhaps as low as $10^{-17}$.

Optical components with less stringent performance parameters are available at lower cost, and the performance degradation can be offset with FEC.

For long links, it is required that the incidence of retransmission be reduced because of the long delays associated with retransmission.

Real time applications may not be able to work with retransmission.

Some of the above issues have been discussed by Grover [1988] and other solutions using polynomial codes have been proposed.

The task force considered the outlines of a specific FEC proposal. A more detailed description is now available in the literature [Benz et al., 1991, McMahon et al., 1992, Springer, 1992]. The proposal includes a table lookup 8B/10B code and an 8 bit shortened Hamming code applied to the coded bits for every 8 information bytes. The FEC bits are Manchester coded. One pair of such coded bits is inserted between the 8B/10B coded bytes. The data transfer rate is reduced from 0.8 to 0.667. A single error in 8 data bytes can always be corrected.

Other approaches to combine error correction with run-length and DC constrained binary codes are described by French [1989], Blaum [1991], Blaum et al. [1993], Coetzee et al. [1990], and others. These studies address the more complex codes for magnetic channels which generally require different constraints from those for fiber optic or metallic transmission channels.

Figure 1:
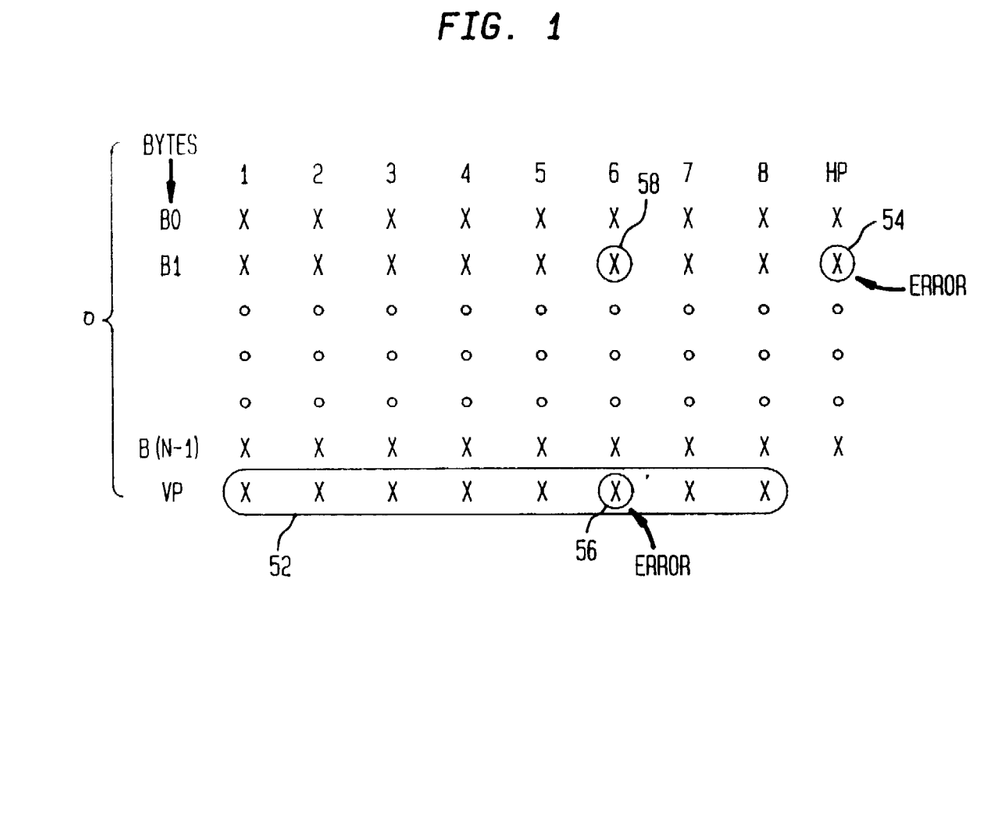
FIG. 1 schematically shows using classical horizontal and vertical parity to correct errors.

Referring to FIG. 1, classical error correction uses a horizontal parity (HP) and a vertical parity (VP). Each "X" in FIG. 1 represents one bit of data. The numbers 0–7 in the raw data array of bits represent the eight locations of an eight bit byte. In the first column, under heading Bytes, B0 to B(N–1) represent 16 bytes of a frame 50 of N bytes. For each bit location of the frame 50, there is a vertical parity bit corresponding to the vertical parity across each of the bytes in the frame. Eight vertical parity bits form vertical parity byte 52. For each of the bytes in frame 50, there is a horizontal parity. When data such as shown in FIG. 1 is transmitted, each byte and its associated horizontal parity are transmitted and the byte 52 corresponding to the vertical parities for each of the bit locations is transmitted with the frame. For each transmitted byte, the receiving machine recomputes a horizontal parity for each transmitted byte and recomputes a vertical parity for the transmitted frame. The recomputed horizontal parity is compared to the transmitted horizontal parity, and the recomputed vertical parity is compared to the transmitted vertical parity. If there is a disagreement, for example, in the horizontal parity 54 for the transmitted byte B1 and, for example, vertical parity bit 56 for bit location 5 for the vertical parity, it is then known that bit 58, which is bit location 5 of byte B1, is in error and the value is changed to the other binary state; that is, if it is a 1, it is changed to a 0 or vice versa.

The raw binary data is generally not transmitted but is first converted into coded data having bytes with a larger number of bits than contained in the raw data bytes. Coding is used for a number of reasons. A delimiter is needed to define word boundaries and frame boundaries. A delimiter is needed to that when data is transmitted, the receiver can determine where the frame of data which is being sent begins. The delimiter is commonly referred to as a comma. Also, it is desirable when transmitting data to have run lengths of consecutive ones or of consecutive zeros which are short in order to provide a steady stream of transitions as timing references to the clock recovery circuit of the receiver. Coded data is used to limit the run length to less than some predetermined value. Also, it is desirable to have data which is DC balanced to the extent that the digital sum variation over any number of consecutive bits is finite and small. If there are a large number of ones or zeros consecutively, the charge levels on reactive components will increase, adversely affecting AC coupling by requiring longer time constants or automatic level restore circuits.

Since coded bytes have more bits than contained in the byte of raw data, it is undesirable to use classical horizontal and vertical parity with coded data since the horizontal parity for the coded data is likely to need more than one bit location in the coded byte. For a frame containing a large number of bytes, the horizontal parity would add a substantially large amount of additional bytes, thereby resulting in a significant impact on the number of bit locations which are carrying useful information.

It is an object of the present invention to provide an improved horizontal parity technique for identifying the location of errors in coded bytes wherein the code does not have local parity and wherein transmission code violations in combination with a limited set (e.g. 8) of parity bits computed from a parameter of each coded byte can locate the error location to a particular byte.

SUMMARY OF THE INVENTION

A broad aspect of the present invention is a method for determining whether a current word in a stream of words having a plurality of frames is an idle word, an end-of-frame word, a start-of-frame word of one of said plurality of frames of words wherein an error can occur in said stream of words, said current word contains four bytes. One of the plurality of frames of words starts with a start-of-frame word and ends with an end-of-frame word. One of the plurality of frames of words is followed by a modified idle word. Between each of the plurality of frames of words there is at least one idle word. Each of the end-of-frame word, the start-of-frame word, the modified-idle word and the idle word has four bytes. One on the four bytes of each of the end-of-frame word, the start-of-frame word, and the modified-idle word is a comma character. Three of the four bytes of the end-of-frame word is a preset end-of-frame subset. Three of the four bytes of the start-of-frame word is preset end-of-frame subset. Three of the four bytes of the modified-idle word is a preset idle subset. One of the four bytes one of the modified-idle-word is a preset modified idle subset. The method contains the following steps: determining if the current word is an idle word. The current word is assumed to be an idle word if three of the four bytes of the current word match three of the four bytes of the idle word and if it is followed by the start-of-frame words. If the current word is not an idle word, determining if the current word is a start-of-frame word. The current word is assumed to be a start-of-frame word if three of the four bytes of the current word match three of the bytes of the start-of-frame word and if a word preceding the current word is an idle word. If the current word is not a start-of-frame word, determining if the current word is an end-of-frame word. The current word is assumed to be an end-of-frame word if either all of the four bytes of the current word match the four bytes of the end-of-frame word and at least one byte of a next word following the current word match the four bytes of the modified-idle word, or if at least three of the four bytes of the current word match the four bytes of the end-of-frame word and at least two bytes of the next word matches two bytes of the modified idle word.

BRIEF DESCRIPTION OF THE FIGURES

Further objects, features, and advantages of the present invention will become apparent from a consideration of the following detailed description of the invention when read in conjunction with the drawing Figures and Table, in which.

Table I illustrates error location with 2 levels of balance bits and Fibre Channel Standard transmission code violations.

DETAILED DESCRIPTION

General Description

An invention described herein is directed to a method to correct a single erroneous byte in a frame. The fundamental principle is using a rectangular arrangement of horizontal and vertical parity bits, where the horizontal parity locates the error and the vertical parity is used to correct it. The distinctive feature is that the functional equivalent of the horizontal parity is provided by a small set of parity bits derived from the byte disparities of the Fibre Channel Standard (FCS) transmission code combined with error detection by the code. The implementation of this error correction scheme can be made transparent to the existing FCS link level hardware and to the FCS transmission protocol. There is no reduction in throughput, but there is added delay equal to the length of a frame.

Figure 2:
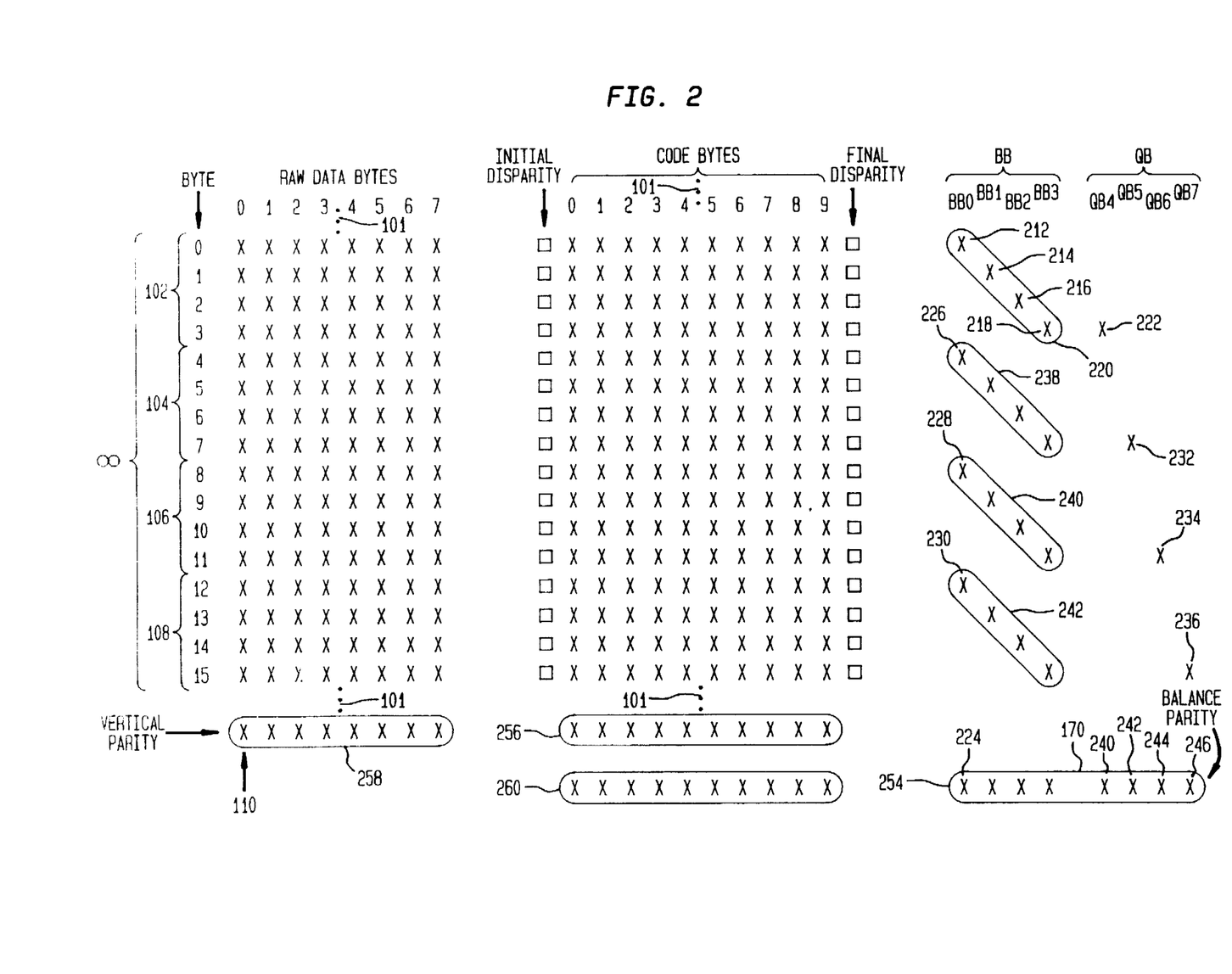
FIG. 2 schematically shows according to the present invention an improved horizontal and vertical parity technique used for coded data.

FIG. 2 shows a modified horizontal and vertical parity technique according to the present invention. Table I is a more specific example of the technique schematically shown in FIG. 2. FIG. 2 shows a frame 100 of raw data. Sixteen bytes are shown from frame 100 which can have any number of bytes which is indicated by the series of dots 101. The bytes of the example of raw data in FIG. 2 have 8 bits, however, a byte can have any number of bits. The raw data is segmented into bytes. 16 of the bytes are labelled from 0-15. Each byte has 8 bits labelled 0-7. The X's correspond to bits of data which typically have a 1 or 0 value. According to the present invention, each raw data byte is transformed into a coded byte. A vertical parity 258 is determined for the raw data of the entire block 100. For example, bit location 0 of the raw data has a corresponding vertical parity bit 110. Vertical parity bit 110 has a value of 1 or 0 depending upon the total number of 1's or 0's in the 0 bit location over the entire frame of raw data. Each coded byte has an initial disparity and a final disparity. The changes in disparity over each byte of the code is constrained to certain values. The initial disparity for each coded byte is the same as the final disparity of the preceding coded byte. The permitted disparity variation over a coded byte is determined by the selection of the coding. Hereinbelow, a code is described and the permitted disparity variation over each coded byte. Each coded byte has a balance BB. Bytes B0, B1, B2, and B3 have balance 212, 214, 216 and 218, respectively. If there are an equal number of 1's and 0's in a coded byte, the balance BB is 1, and if there are an unequal number of 1's and 0's in a coded byte, the balance BB is 0. Another balance corresponds to each word. For example, balance bits BB 212, 214, 216 and 218 together form a balance 220 corresponding to word 102. As shown in FIG. 2, each one of the words 102, 104, 106 and 108 has a word balance 220, 238, 240 and 242, respectively, associated therewith. Each one of the word balances, for example, balance 220 has a balance bit QB. The QB bits corresponding to balance byte 220, 238, 240 and 242 are 222, 232, 334 and 236, respectively. A balance vertical parity is determined from the two groups of balance bits BB and QB. The 0 bit location of the balance parity 254 is the parity of the BB0 bits, that is, parity 224 is the parity of bits 212, 226, 228, 230, . . . . Correspondingly, balance parity bits 248, 250 and 252 are the parities of the BB bits in bit location BB1, BB2, and BB3, respectively. The balance bits QB 222, 232, 234 and 236 are the balances, respectively, of word 220, 238, 240 and 242. Bit 240 corresponding to bit location QB4 is the parity of all the bits which are in the bit location QB4. Correspondingly, balance parity bits 242, 244 and 246 are the parities of the balance bits in bit location QB5, QB6 and QB7, respectively. The balance parity 254 which is an 8-bit word is coded as a 10-bit byte 260. Vertical parity 258 which is an 8-bit byte is coded to a 10-bit byte 256. The machine which is transmitting the data transmits frame 100 including the coded vertical parity byte 256 and the coded balance parity byte 260. The receiving machine receives the coded bytes corresponding to frame 100 and generates a recomputed vertical parity corresponding to vertical parity 258 and generates a recomputed balance parity corresponding to balance parity 254. The receiving computer first looks at the coded bytes to determine if any of the bytes are an invalid arrangement of 1's and 0's. For the coded data, only certain arrangements of 1's and 0's are valid coded bytes. Others are not part of the code and, therefore, are invalid. If an invalid coded byte is found, it is known that an error is contained within that byte. If an invalid coded byte is found, it is corrected by looking at the recomputed vertical parity as compared to the transmitted vertical parity to identify which bit locations in the coded byte are in error. The value of the coded bits which are in error is then changed from a 1 to a 0 or vice versa.

If there are no code violations, the disparity of each coded byte is checked to determine if there is a disparity violation. The variation in the disparity from the initial disparity to the final disparity of each valid coded byte is constrained within the code to be within a certain range, for example, the change in disparity over a valid coded byte could be limited to zero and plus or minus 2 as is the case for the FCS code. Also, for a code to limit the digital sum variation to be between a maximum and minimum value, the polarity of coded bytes with non-zero disparity must alternate as described in detail hereinbelow to avoid a disparity violation. If there are no disparity violations in the disparities of each of the coded bytes within the transmitted frame, no errors are detected and nothing is done.

As stated herein above, if there is an invalid character, it is corrected by the vertical parity. An invalid character can be followed by at most one disparity violation in the disparities of each of the coded bytes. If there are more than one disparity violations following the invalid byte, more than one byte has an error and it cannot be corrected. Therefore, the receiving machine requests that the transmitting machine retransmit the frame of data.

If there are no invalid bytes and a disparity violation is observed, the above described horizontal and vertical parity scheme to identify the location of the error is used.

For the Fibre Channel Standard transmission code, it has been calculated that statistically an error is with high probability within 16 bytes proceding the identified disparity violation for the case of random data. The probability that the error is more than 16 bytes preceding the disparity violation is about $2 \times 10^9$. As described above, the balance parities identify the location of the byte having the error and the vertical parity identifies the location of the particular bits having errors. The procedure described above using a vertical parity and a new balance parity, according to the present invention, is used with codes which do not contain local parity. Therefore, the procedure described above supplements codes which do not have local parity. The FCS code as described by Widmer [1983] does not have local parity and, therefore, the ability to identify errors is supplemented by the procedure described above according to the present invention.

An alternative solution as referred to above is to use a code which has local parity. In a code with local parity, each 8-bit byte has unique coded 10-bit bytes which correspond thereto. The coded bytes are designed such that if there is an error in any one of the bit locations, the valid coded byte would be converted into an invalid coded byte. Such a code has been described by Martin [1985].

DETAILED EXAMPLE

When using FCS transmission code violations for error locating, Balance Bits BB and BQ are defined for each coded byte and 4-byte word, respectively, with a value of one for balanced blocks and zero otherwise. Sets of 4 BB and 4 BQ bits are each arranged diagonally in separate quadruplets for successive groups of 4 bytes and 4 words, respectively. A parity bit is derived for each of the diagonal bit positions of all the BB and the BQ sets of a frame. Only these 8 parity bits BPAR are transmitted after the end of the frame. For random data, the FCS code by itself locates all single byte errors to a range of 16 bytes except one error in $5 \times 10^8$ errors. Violations in the received BPAR bits are used to trace an error more precisely to a specific byte of the 16 byte group identified by the code. A set VPAR of 8 vertical parity bits derived from the uncoded data, and the 8 BPAR parity bits are coded and packed into the first Idle word following the End of Frame. After identification of a faulty byte at the receiver, the VPAR bits are used to correct it.

Initially, the elementary rectangular error correction scheme using parity bits is described. Then the use of horizontal parity to locate an error will be described. An improved technique is presented which locates an erroneous byte in a frame by the FCS transmission code combined with 8 parity bits transmitted after the end of the frame. Then the correction of an erroneous byte by vertical parity bits is described as well as the restoration of faulty control characters. A detailed description is given on how to correctly identify the start and the end of a frame in the presence of an error. Finally a description is given on how to correct errors in FCS frames using the principles described here in a way which is transparent to existing link level hardware and FCS protocols. The conclusions evaluate the suitability of the this error locating techniques for applications with predomimately very short or long frames. An appendix describes in detail the error locating capabilities of the FCS 8B/10B code.

Elementary Correction Scheme

The basic correction scheme proposed according to the present invention is based on ordering of data and parity bits, as shown in FIG. 1, in a rectangular or matrix arrangement. A frame is partitioned into small segments, preferably bytes or words. A parity or other means of error detection is attached to each of the segments, and together they form a matrix line. Successive segments are placed on the following lines. This first set of parity bits is called the horizontal parity.

Several of these segments are followed by a vertical parity set as indicated in the matrix in Table I. The vertical parity consists of a parity bit for each data bit column. It is used to identify and correct the erroneous bit or bits in the segment which was tagged as erroneous by the horizontal parity.

An entire faulty line can be corrected. For this reason, the vertical parity is computed on the uncoded bits, since error spread from decoding contained to a segment or byte does not interfere with correction. The vertical parity has enough bits to cover at least one segment. To correct longer error bursts, two or more vertical parity lines may be appended; by way of example, a first parity can be calculated from all the even numbered lines, and a second one from all the odd numbered lines. It is then possible to correct error bursts extending over a pair of adjacent lines, or two isolated shorter bursts, if one of them occurs in an even and the other in an odd numbered line. The vertical parity lines are coded like data. If an error occurs in a vertical parity byte, it is ignored and not used for correction of possible other errors.

A necessary assumption is that, apart from short error bursts, the link error events occur randomly at a low enough rate so most of the time there is just a single error event within a frame. If this assumption does not hold, the frame length must be reduced, or a vertical parity must be inserted into the frame at fixed intervals. Another assumption is that most errors are confined to a single matrix line. The systems and methods shown described herein can be adapted to handle errors crossing line boundaries at the cost of increased complexity. It is a further requirement to have correct recognition of the start and the end of the frame in the presence of errors. A cyclic redundancy check computed over the frame ultimately determines the validity of the corrected or uncorrected frame. Retransmission facilities are preferably still available for the case where error correction fails: failure of the horizontal parity to detect certain multiple errors, an error burst longer than the vertical parity, lost byte synchronization, multiple error bursts, false start and end of frame detection, truncated or missing frames, etc.

Horizontal Parity

In the commonly used parity matrix, the horizontal parity is an explicit bit for each matrix line.

In the example below, the horizontal parity is instead supplied by the combination of a transmission code and a few parity bits at the end of the frame, computed on features of the code which are guaranteed to change for an odd number of errors. Transmission codes are subject to several constraints to enhance reliable low cost transmission. Additional constraints can be built into a code, so any odd number of errors in a byte or word generates an invalid word. Such a property of the code is referred to as 'local parity' [Martin, 1985]. For general applications, such codes are less desirable, because the added constraint makes it necessary to degrade some transmission parameters, and to accept a more complex and higher cost implementation. Other 8B/10B codes, including the FCS Standard code, most times also indicate immediately an invalid byte when an error has occurred. However, a substantial ratio of errors generates only a disparity violation farther down the bit stream, away from the byte where the error occurred, and so the byte which contains the error(s) cannot directly be identified.

Horizontal Parity with Fibre Channel Standard Transmission Code

On average, two out of three single bit errors on a FCS link generate an invalid character or a disparity violation at the location where the error has occurred. Another disparity violation further along the bit stream may also show up. However, an error may sometimes produce simply another valid character without violating the disparity rules up to that point. Nevertheless, a disparity violation will then appear no later than in the End of Frame delimiter, depending on the transmitted data pattern.

It is shown in the appendix that for random data preferably a single error in a coded byte of the FCS 8B/10B transmission code makes it invalid with a probability of 0.65. The probability of an error being missed in the byte where it occurs, or the next three bytes, is 0.008; the chance for it to remain undetected by the end of the first 8 or 16 bytes is $5 \times 10^{-5}$ and $2 \times 10^{-9}$, respectively. Extending the search over 16 bytes makes sufficient allowance for the fact that the data patterns may not fit the random model. For other, non-partitioned 8B/10B codes, over 40 bytes are needed to get comparable statistics.

If we are satisfied to correct all but about one in 100 errors, a brute force approach might be appropriate. On the first occurrence of a code violation, the assumption would be that the error was in that or one of the 3 preceding bytes. Correction would be accomplished by a 4 byte vertical parity. A large set of vertical parity bits with some modified locating rules also would be beneficial for links afflicted with a significant number of burst errors. However, to make the expense and adverse impacts of FEC worthwhile, the correction rate must be better than 99% for most applications. The error location can be determined more precisely by supplemental procedures as follows:

For an illustration of the next few paragraphs refer to Table I. The details of the table are explained later in the section entitled "A Frame with Error Correction Bits".

To locate the erroneous bye, a virtual bit, the balance bit BB, is attributed to each coded byte. A BB bit has a value of one for balanced vectors, and zero otherwise. The BB bit is not transmitted, it is just used to compute a set of parity bits as described below. If binary byte numbers are assigned as address to all bytes of a frame in ascending order, then BB0 is the balance bit of any byte with a low order binary address 00; BB1, BB2, and BB3 cover the binary byte address 01, 10, and 11, respectively. In other words, if the block structure is made up of 4 byte words, as happens for FC, then BB0 is the balance bit of the first byte of a word, and BB3 of the last byte of the word. An odd parity bit PB0 is computed for the set of all BB0 bits. PB1, PB2, and PB3 provide odd parity for the sets of BB1, BB2, and BB3 bits, respectively. The parity bits PBx are appended to the end of the frame. An error in the transmission channel will change the value of a balance bit BBx with a low order binary byte address x, which in turn will produce a parity violation for the respective PBx parity bit at the end of the frame as BPAR. The error also generates a code violation at a location y. The location y of the code violation may be identical to the error location x, or y may be located a few bytes after x. The full address y of the violation is recorded. The assumption is then made that the error location is the byte with low order address x at location y or the next preceding address with x in the low order position.

Lets say an error occurred in a byte with the binary address '$0_{13}1110$' and did not generate a code violation at that point, but only a disparity violation 3 bytes later at address '1_0001'. In the receiver, the address '$1_{13}$ 0001' is recorded. At the end of the frame, PB2 will in violation and thus indicates that the error occurred in a byte with low order binary address '10'. The assumption is that the error was in the set of 4 bytes ending with the transmission code violation at address '1_0001'. Reducing this address in steps by one until the two low order bits match '10' results in the address '0_1110', the actual location of the error.

A locating range of just 4 bytes is generally not enough, but the range can be extended at will by the addition of more PBx bits. However, this is not the most efficient and lowest cost approach. An extension of the range to 16 bytes can be accomplished by the addition of just 4 more parity bits. A second level of balance bits BQ0, BQ1, BQ2, and BQ3 is attributed to consecutive 4 byte words with low order address 00xx, 01xx, 10xx, and 11xx, respectively. BQy is a one for every coded word with an equal number of ones and zeros. The value of BQy can be derived most efficiently as the even parity of BB0, BB1, BB2, and BB3 of word y. Again, a set of 4 odd parity bits PQ0, PQ1, PQ2, and PQ3 is derived from the set of all BQ0, BQ1, BQ2, and BQ4 balance bits, respectively, and then appended to the end of the frame. On the occurrence of a code violation, the assumption is made that the error occurred in one of the series of 16 bytes ending with the code violation.

An error will cause a transmission code violation which points to a set of 16 consecutive bytes likely to contain the error. A parity violation in a PQy bit identifies the specific erroneous word from the set of 4 words flagged by the code, and a violation in a PBx bit points to a particular byte in that word. The function of the PQy and PBx quadruplets is solely to enhance the error locating capabilities of the FC transmission code, not to correct the error.

Vertical Parity for Error Correction

An odd parity bit is derived for each column of the coded or uncoded matrix, and transmitted in coded form after the end of the frame. For easy implementation, it is preferred to derive the parity from the uncoded data, because of better compatibility with common data formats, buffer width, and the processing stream. Typically, one byte of vertical parity bits will be generated, but a larger or smaller segmentation is possible. At the receiving end, the FCS decoder may enlarge a single bit error to a burst of 5 or 3 in the decoded domain, depending on whether the error occurred in the first 6 or last 4 bits of a coded byte, respectively. The matrix correction scheme is not adversely affected by this error spread.

The decoder should be built so it can distinguish between inherently invalid bytes, and simple disparity violations, which may be caused by an error in a preceding byte. For the correction of inherently invalid bytes, the procedure described in the preceding paragraph for locating the erroneous byte can be bypassed. A single disparity violation following an invalid byte is ignored. If more than one disparity violations follow, no correction should be attempted. After the end of a frame has been received, each bit of the invalid byte in a column with a vertical parity violation is complemented. If more than one byte in a frame is invalid, no correction attempt is made.

If the first violation is a disparity violation rather than an outright invalid byte, the location of the faulty byte must first be determined with the help of the parity violations of the balance bits PQy and PBx as described under "Horizontal Parity with Fibre Channel Standard Transmission Code" above. Then correction is done as above. Correction is suspended, if the disparity violation is followed by an invalid byte or by more than one other disparity violation, which all indicate multiple errors in different bytes.

An error located in the parity bytes is normally ignored. Assume that frames are protected by a powerful cyclic redundancy check as well, which will detect false corrections and errors not detectable by the transmission code.

Burst Errors

If a link is afflicted with a significant number of burst errors spread over less than 10 coded bits, one would want to be able to correct errors which straddle byte boundaries. Modified error locating rules would be required to produce a best assumption about the location of the error burst start and end. For the partitioned FCS code, the resolution of the error location can be enhanced by the addition of extra balance bits BB and the related 2 BPAR bits for the first 6 bits and the last 4 bits of the coded byte. If it is determined that an error burst extends over the last 4 bits of a byte and the first 6 bits of the next byte, the trailing 3 vertical parity bits are then used to correct the trailing 3 bits of the first byte, and the leading 5 vertical parity bits correct the first 5 bits of the next byte.

Recovery of Special Characters

The case of special characters which are afflicted with errors deserves extra scrutiny. For applications which use a variety of special characters in unpredictable configurations, an additional vertical parity bit is used for the K bit, which indicates whether a byte is data or control information. For the Fiber Channel application this bit would be useful only to correct errors in the K28.5 character of the Start and End of Frame delimiter which is done by other means described below.

Fibre Channel Start and End of Frame Detection

It is very important to correctly recognize the Start of Frame (SOF) and the End (EOF), otherwise the parity correction scheme does not work. At the transmitter, this is no problem, because of the absence of errors. Our goal below is to recognize the frame boundaries at the receiver correctly, unless there are at least two bytes with errors. It is unfortunate, that the SOF and EOF ordered sets defined by FCS are not optimized for this endeavor; replacing K28.5 by K28.7 in EOF, and perhaps also in SOF, would help. Also, the Huffman distance between the other 3 bytes of the Idle and SOF could be increased. However, we assume below FCS formats to maintain compatibility, except that the first Idle word following EOF is replaced by a parity word PP at the transmitter. It is restored to Idle at the receiver. For error correction to operate satisfactorily, it is a requirement that loss of word synchronism within a frame occurs several orders of magnitude less often than simple bit errors. The receiver must be operated in explicit word alignment mode to prevent loss of synchronism resulting from just one or a few errors.

Figure 3:
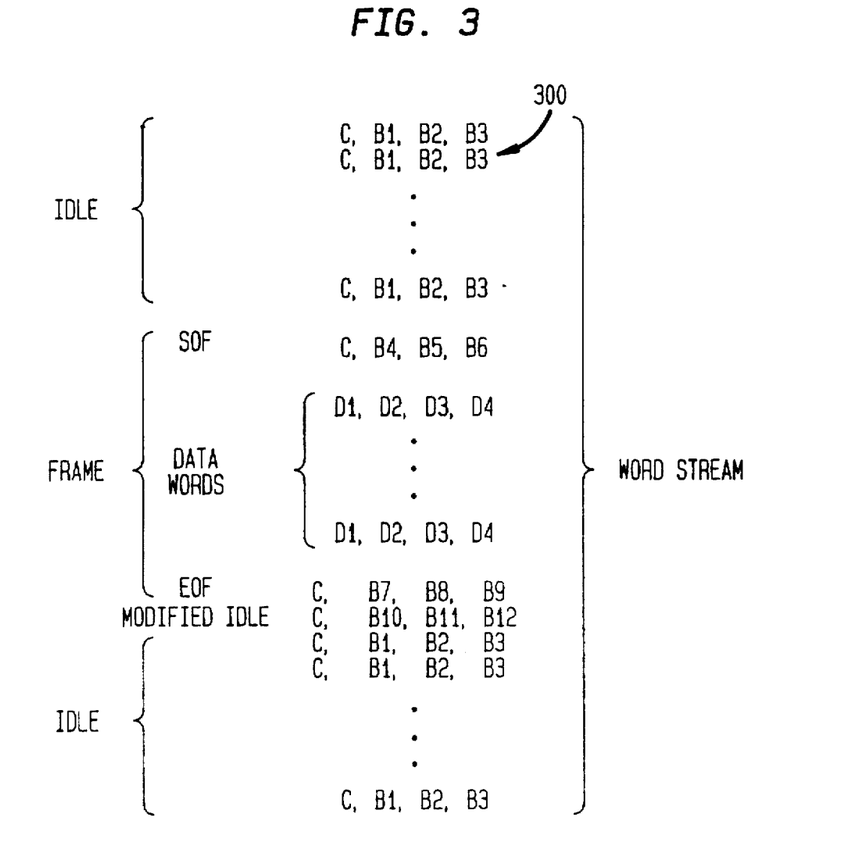
FIG. 3 schematically shows a method and apparatus according to the present invention for detecting a start and end-of-frame.

FIG. 3 schematically shows a method and apparatus according to the present invention for detecting a start and end-of-frame. FIG. 3 shows a word stream wherein each word is composed of four bytes. Each of the idle words, the start-of-frame (SOF) words, the end-of-frame (EOF) words and the modified-idle word contain a comma as one of the four bytes; the comma is preferably the first byte of each of these words.

The Idle word is "C, B1, B2, B3" (which in the example of Table I are identified as IDLE0, IDLE1, IDLE2 and IDLE3) wherein C is the comma, B1, B2, and B3 need not be the same byte but can be chosen from a set of greater than three characters (the idle-word subset). The SOF word is "C, B4, B5, B6" (which in the example of Table I are designated as SOF0, SOF2, SOF3) wherein C is the comma. B4, B5 and B6 need not be the same byte but can be chosen from a set greater than three characters (the SOF word subset). Usually several different SOF words are defined.

The EOF word is "C, B7, B8, B9" (which in the example of Table I are designated as EOF0, EOF1, EOF2 and EOF3) wherein C is the comma, B7, B8 and B9 need not be the same byte but can be chosen from a set greater than three characters (the EOF word subset). Usually several different EOF words are defined.

The modified-idle word is "C, B10, B11 and B12" (which in the example of Table I is PP0, VPAR, BPAR and PP3)

wherein C is the comma. B10 and B11 are the parities VPAR and BPAR and B12 can be chosen from a set of greater than one character (the modified-idle subset).

The machine monitors the word stream to determine if the current word (for example word 300 in FIG. 3) is an idle word (i.e. in the mode), an SOF word, a data word, an EOF word, or a modified idle word. The frame of words starts with the SOF word and ends with the EOF word. The modified-idle word comes after the EOF word.

If an error exits on a bit of an idle-word, a SOF word, an EOF word, or a modified-idle word, the start and end-of-frame can still be detected using the following method. In the idle state, the machine monitors the current word to determine if the current word is an idle word or a SOF word. If three of the four bytes of the current word do not match with three of the four bytes for a SOF word, it is determined the word stream has not left the idle mode. The byte which does not match has a bit error. If three of the four bytes of the current word match a SOF word, than the current word is an SOF word and the beginning of a frame. If the current word is not an idle or a SOF word, then the machine does not enter the frame state.

In the frame state, the machine monitors for the presence of a EOF word. Error free data words do not match with the SOF, EOF, idle and modified idle words because they have no comma character. The current word is determined to be an EOF word (and the end of frame) if either three of the four bytes of the current word match the bytes of an EOF word and at least two of the bytes of the next word match the corresponding bytes of the modified-idle word, or if the current word matches all four bytes of an EOF word and at least one byte of the next word matches a corresponding byte of the modifies idle word.

Recognition of SOF

Special procedures to recognize the frame boundaries in the presence of a single erroneous byte must guard against starting a frame too soon because of an error in the Idle, or too late because of an error in SOF. We describe below SOF recognition in terms of the coded bits, because that gives more time to change the operating mode of the correction circuitry at the receiver. If the coded bytes are not accessible, the rules can be translated for the uncoded domain.

The correction circuitry is either in the Idle state or the Frame state. The transition from the Idle state to the Frame state must be made when SOF is received. The FCS Idle sequence [Committee, 1992] is K28.5-D21.4-D21.5-D21.5. The SOF sequence is K28.5-D21.5-Dx.y-Dx.y, where x=21, 22, 23, or 24, y=0, 1, or 2. An examination of the coded bits reveals that a change from Idle to any of the versions of SOF entails a change from zero to one for the last bit (j) of the third and fourth byte, and for the seventh bit (f) of the second byte. The 10 bits of a coded byte are labelled in sequence with 'abcdeifghj' according to FCS notation. Starting from the Idle state, we can thus reliably recognize SOF, if any two of the above three bits change to one. To formally describe the conditions, the following notation is used: B0w, B1x, B2y, and B3z stand for the 4 bytes of a word; the letters wxyz identify a one bit in a particular bit position (abcdeifghj) the plus sign(+) and bullet (·) stand for the Boolean OR and AND function, respectively. The path from the idle state to the frame state is taken at the start of the word which meets the following condition:

$$B1f \cdot B2j + B1f \cdot B3j + B2j \cdot B3j$$

Recognition of EOF

Reliable recognition of EOF for certain data patterns and error locations is difficult. The probability of correct EOF determination can be improved by more checks extending over several words. In the following, the EOF checks rely on all or part of 6 bytes in the EOF and the PP word, which is created by the correction circuitry right after the EOF word. Note that for purposes of error correction, the frame ends with the PP word. The checks are based on the coded received data.

The EOF sequence has the following format: K28.5-Du.v-D21.w-D21.w, where u=21 or 10, v=4 or 5, and w=3, 4, 6, or 7. The disparity after the second and the last byte of this word is always negative. The last 3 bits 'ghj' of byte B1 are always '010'. The first 8 bits 'abcdeifg' of the last 2 bytes B2 and B3 are always '101010×1'.

The PP word starts and ends with negative disparity, and has the following format: K28.5-Dm.n-Dp.q-D3.v, where m, n, p, and q are not restricted, and v is 4 or 5 as required for negative ending disparity. The last byte B3 of the PP word in coded form is thus '110001×010'.

To describe the end of frame conditions in the presence of an error, the terms listed below are defined. The EOF word is assigned the subscript 0 and PP is identified by subscript 1.

$B0n_0$=0011111010 for EOF byte B0 with negative starting running disparity $B0p_0$=1100000101 by EOF byte B0 with positive starting running disparity $B0_1$=0011111010 for PP byte B0

$B1.21_0$=101010xxxx for EOF bye B1 bits $B1.10_0$=010101xxxx for EOF byte B1 bits $B1.4_0$=xxxxxx0010 for EOF byte B1 bits $B1.5_0$=xxxxxx1010 for EOF byte B1 bits $B2_0$=101010x1xx for EOF byte B2

$B3_0$=101010x1xx for EOF byte B3

$B3_1$=110001x010 for PP byte B3

An EOF is recognized in word position 0 for the conditions A through F below. All conditions include at least one control character.

Conditions A and B make allowance for errors in the first or last byte of PP.

$$A = B0n_0 \cdot (B1.21_0 \cdot B1.10_0) \cdot B1.4_0 \cdot B2_0 \cdot B3_0 \cdot (B0_1 + B3_1)$$

$$B = B0p_0 \cdot (B1.21_0 + B1.10_0) \cdot B1.5_0 \cdot B2_0 \cdot B3_0 \cdot (B0 + B3_1)$$

Conditions C and D make allowance for errors in one of the last two bytes of EOF.

$$C = B0n_0 \cdot (B1.21_0 + B1.10_0) \cdot B1.4_0 \cdot (B2_0 + B3_0) \cdot B0_1 \cdot B3_1$$

$$D = B0p_0 \cdot (B1.21_0 + B1.10_0) \cdot B1.5_0 \cdot (B2_0 + B3_0) \cdot B0_1 \cdot B3_1$$

Condition E makes allowance for errors in the second byte B1 of EOF.

$$E = (B0n_0 + B0p_0) \cdot B2_0 \cdot B3_0 \cdot B0_1 \cdot B3_1$$

Condition F makes allowance for errors in the first byte B0 of EOF.

$$F = (B1.21_0 + B1.10_0) \cdot (B1.4_0 + B1.5_0) \cdot B2_0 \cdot B3_0 \cdot B0_1 \cdot B3_1$$

With the above conditions, a single erroneous byte will not obliterate the recognition of EOF, and it is also unlikely that it generates an early, false EOF. The following observations can be made:

If errors generate a spurious control character K28.5 in position B0 of a word other than the one before EOF, at least 31 coded data bits must match a prescribed pattern to meet conditions A, B or F above. The conditions C, D, or E cannot be met with any data pattern.

If errors generate a spurious control character K28.5 in position B0 of the word beforeEOF, at least 24 coded data bits must match a prescribed pattern to meet conditions A, B, or F above. The other conditions cannot be met with any data pattern.

Figure 4:
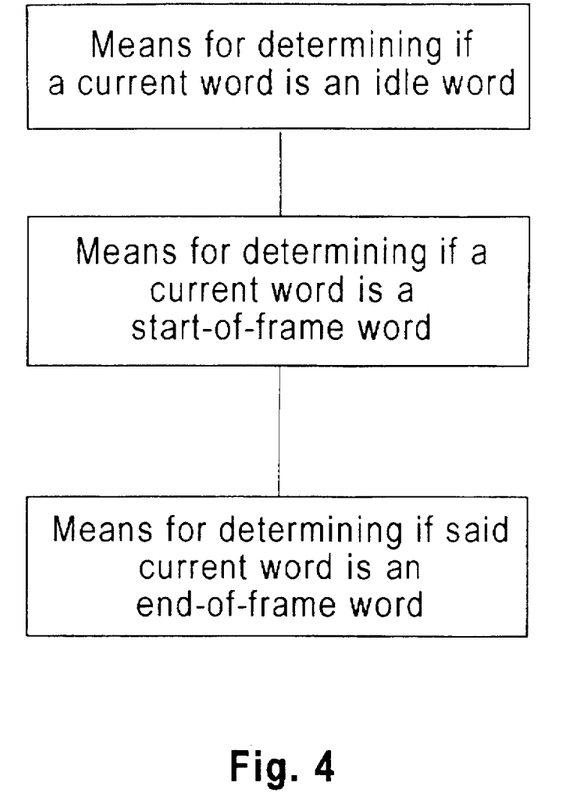
FIG. 4 schematically shows an apparatus for determining whether a current word in a stream of words is an idle word, an end-of-frame word, a start-of frame word on a frame of words wherein an error can occur in said stream of words.

FIG. 4 schematically shows an apparatus for determining whether a current word in a stream of words is an idle word, an end-of-frame word, a start-of-frame word on a frame of words wherein an error can occur in said stream of words.

Return to Idle State

The SOF and EOF recognition circuits return to the Idle state after recognition of EOF. Errors in multiple bytes could prevent recognition of EOF. To avoid a hung-up condition and to force a return to the Idle state before the start of the next frame, the Idle state is forced if a first word starts with '001111010' and is followed by another word, which matches the Idle word bit for bit

'001111010.1010100010.1010101010.1010101010'.

The requirement for 2 consecutive control words prevents a premature return to the Idle state because of a single faulty byte within a frame.

An Example of Error Correction with Fibre Channel Code

Structure of Error Correction Circuits

The error correction scheme described above lends to various implementation. One could exploit it to correct short error bursts crossing byte boundaries. This requires more complex rules. The example below addresses errors confined to a single byte. It is assumed that the error correction is an appendix to existing architectures, and an attempt is made to minimize hardware modifications of existing macros to accommodate error correction.

Transmitter Port

At the transmitter end, the vertical parity bits VPAR are derived from the uncoded data starting with the first byte of SOF and ending with the last byte of EOF. The balance bits BB are a by-product of the coder, they can be derived from the block disparities of the 6B and 4B vectors, or by monitoring the changes in the running disparity from byte to byte. For either method, only 4 to 6 additional gates are required to determine the BB value for each byte. The parity bits BPAR are derived from the BB bits. Both VPAR and BPAR are coded and substitute the second and third byte of the first Idle word following EOF. The forth byte of this Idle is changed to D4.5 or D4.4, as required for ending the word with negative disparity, using the same controls (K,M) and circuits as for the second byte to EOF. For this last byte, the input of the coder is always presented with D4.4, K=0, and M=1. The coder will then automatically change D4.4 to D4.5, if required to obtain a negative ending disparity, as described in the next paragraph.

Special Fibre Channel Requirements: FCS defines Ordered Sets which are used as Frame Delimiters, Primitive Signals, and Primitive Sequences. All these sequences start with the special character K28.5 and are followed by 3 data characters. The standard requires that many of the Ordered Sets start with a negative disparity. To force a negative starting disparity, the attached communications adaptor must assert a control line M together with the control line K. Similarly, the End of Frame Delimiter must always end with negative disparity, which is accomplished by manipulation of the 4B part of the second byte of the ending delimiter, which is a data byte. The data point Dx.5 is used in this position to go from positive to negative disparity, and Dx.5 is used to maintain the existing negative disparity. To get the desired result, the adapter will always present Dx.4 in this position and assert the M line, but not the K line. The coding circuitry will then force bit F to one if the running disparity at the start of the byte is −1. This procedure converts Dx.4 to Dx.5 to produce always a negative ending disparity.

Intermediate Nodes

In a system, error correction may be done strictly on a per link basis, i.e. between a single transmitter and receiver, or end to end, which may include several links and switches. In the first case, this proposal can be made invisible to the higher levels of the architecture. The transmitter simply modifies the last 3 bytes of the first Idle after EOF. At the receiver, the error correction circuitry connects to the deserializer and the decoder. It corrects the frames before passing them on the next level, and it restores the first Idle word. For this approach it does not matter how the switch handles the Idles.

If error correction is done end to end, intermediate nodes such as switches must not disturb the word following EOF. One must make sure that switches pass the PP word along unchanged. Idle word additions or deletions must occur after the PP word has passed.

Receiver Port

At the receiver end, there are more options to evaluate. On might want to use the existing data buffer. When a parity error is detected and located, that particular byte in the buffer is corrected. But then the CRC for the frame has to be re-computed to assure validity. This interferes with normal data flow and control operations, and it cannot easily be merged into existing complex chip structures. However, it has the functional advantage, that there is no extra delay, if there are no errors.

For now, a more practical and easy approach is to store the received frame in a dedicated buffer between the decoder and the next level of hardware. After a complete frame has been received and after the erroneous byte, if any, has been located, the data transfer to the next level starts, and the faulty byte is corrected on the fly. There may be an extra line or other means to indicate that the received data has been modified for better monitoring of link performance. The Idle following EOF is restored to a normal Idle, so the error correction can be totally transparent to the higher levels of the protocol.

Alternatively, with more complex controls, it is possible to transmit a received frame directly to the higher level to avoid delays in the absence of errors. An erroneous frame would then immediately be followed by the corrected frame in the case of an error. The buffer then switches to first-in first-out mode, until it catches up with the data flow by eliminating extra Idles. Apart from complexity, this also requires the upper level protocol to be aware of this mode of operation.

For the buffer size, the following factors are to be considered:

1. The frame size must be constrained, so more than one erroneous byte in a frame is unlikely.
2. The added latency from diverting the data through the buffer should be evaluated for the specific application, before selecting frame and buffer size.
3. Cost may be a consideration.

A Frame with Error Correction Bits

A specific example of a frame format including check bits for locating and correcting errors is illustrated in Table I. Error location with 2 levels of balance bits.

15

General Explanation of Table I

The error correction matrix referred to above is supplemented by indexing columns to the left and to the right. The nomenclature follows FCS conventions and is also described in an article by Widmer [1983]. Briefly, the entries in the 'BYTE NAME' column are just a shorthand description of the particular byte on the line 'RAW DATA' contains a byte of uncoded data and an extra bit K, to indicate regular or control data. Each raw byte is translated to the 10-bit constrained pattern to its right. The Column DF shows the required running disparity at the start of a byte. The column DB shows the block disparity of the coded byte. The function of the BB and BQ bits has been explained above. Note, they are just bits to describe a feature of the coded byte to the left, and are not transmitted. To the right is a binary address for each byte of the frame in ascending order. The last column with the heading 'FRAME' identifies the function of words other than data.

The top character in the Table is a synchronizing control character; together with the next 3 bytes it represents an Idle word. It is followed by the Start of Frame delimited and several data words. The End of Frame delimiter is represented by the 4 bytes starting with the next K28.5 character near the bottom. In a real frame, it would be preceded by a 4-byte CRC, but for this compact example of a frame, the space between the delimiters has been filled with arbitrary data. EOF is followed by the PP word which contains all the parity bits, VPAR and BPAR, needed for this proposal. It is followed by at least one Idle word (not shown).

The first byte of the PP word (K28.5) remains the same as the for Idle word. The VPAR and BPAR bytes in the second and third byte position have been discussed previously. Extra parity bits could be packed into the fourth byte. In this example, the 6B part of the last byte has been changed from D21 to D4. This allows a more reliable recognition of the EOP delimiter if there is an error in the first byte of EOF. The 4B part of the last PP byte is used to force a negative ending disparity as explained under 'Transmitter Port' above. The FCS rules provide always at least 2 Idle words between frames, so there remains at least one Idle before the start of the next frame.

Detail Explanation of Table I

1. At the transmitter, a vertical parity byte VPAR is generated. Bit A of VPAR is the odd parity for the A bits of all bytes in the frame. Similarly, bit B of VPAR represents the odd parity for all B bits of the frame, and so on. VPAR is encoded in the normal way and placed in the second byte of the Idle word following the End of Frame (EOF) delimiter.

2. An additional 8 parity bits BPAR are generated based on the balance bits BB and BQ of the frame.

The balance bits BB are available from the coder for each byte of a frame. The BB bit is one if there are 5 ones and 5 zeros in a coded byte, otherwise it is zero. A first odd parity bit BPAR A is derived from the balance bits BB0 with low order byte address 00. The second BPAR parity bit B is derived from the BB1 bits which have a low order byte address 01; BPAR bits C and D are derived from BB2 and BB3 which are assigned to bytes with low order address 10 and 11, respectively. The BQ bits have a value of one, if a word has 20 ones and 20 zeros. They can also be derived as the odd parity of the 4 BB bits of a word. The fifth BPAR bit E is the odd parity bit derived from the BQ0 bits of word address 00xx. The F, G, and H bits provide odd parity for all BQ1, BQ2, and BQ3 bits, respectively. These 8 BPAR bits

16 are also coded and transmitted in the third byte of the Idle word following the EOF delimiter.

3. At the receiver, special circuitry, as described under 'Fibre Channel Start and End of Frame Detection', determines the start and end of the frame even in the presence of a faulty byte. If the first byte of the SOF or EOF word is in error, it is corrected to K28.5 which is 'ABCDEFGHK=001111011' in the decoded domain. Parity generation for VPAR and BPAR is started with the first byte of SOF and ends with the last byte of EOF.

4. At the receiver, the balance bit BB is obtained from the decoder for each byte with negligible additional hardware. The BB bits are used to generate the BQ and BPAR parity bits in the same way as at the transmitter and then discarded. The receiver generated BPAR bits are retained and compared with the BPAR byte received in the PP word.

5. At the receiver, the vertical parity bits VPAR are derived from the decoded data. The decoded data is stored in a dedicated buffer. For an invalid byte, an arbitrary decoded pattern can be assumed, i.e. whatever the decoder generates.

6. If a first invalid byte in a frame has been received, its byte address is stored in a buffer. A special character in the wrong position of a word is considered an invalid byte (The FCS protocol allows special characters only in the first position of 4 byte words). A single disparity violation following the invalid character is ignored. If the invalid byte is followed by a second invalid byte or more then one disparity violation, the frame is not correctable. After the complete frame has been received, it is read out of the dedicated frame buffer and transferred to the next level of the transmission protocol. Any correctable erroneous byte, as indicated by the byte address stored in the special buffer, is corrected on the fly by complementing those bit positions for which the VPAR bits received disagree with the locally generated VPAR bits.

7. If an otherwise value byte with a disparity violation is received, its byte address is retained. If this disparity violation is followed by an invalid character or by more than one other disparity violation, the frame can not be corrected except through retransmission, because of errors spread over several bytes. If one or two disparity violations and no invalid bytes exist, we assume that the error occurred within the 16 bytes ending with the first disparity violation. The exact location is indicated by a mismatch between two bits of the received and the reconstructed BPAR byte. We go to the end of the frame and check which two of the 8 BPAR bits are false. The byte address of these false BPAR bits is compared with the low order 4 digits of the byte address for the first disparity violation. If the byte address of the false BPAR bits is larger, then the byte address is decremented by 16. In either case, the 2 low order digits of the byte address are replaced by the those of the false BB bit, and the next higher 2 digits by those of the false BQ bit. The resulting modified byte address points to the putative faulty byte. It is corrected in the same way as an invalid character described above.

As an example on how to locate the faulty byte, let's say that the last coded byte j of the byte with address '0 1101' has been changed by an error from 0 to 1. This will generate a disparity violation for byte address '1 0001'. At the receiver there will also be a mismatch for the BB1 and BQ3 parity bits, as represented by the B and H bit of BPAR, respectively. All BB1 bits and BQ3 bits have address numbers 'xx01' and '11yy', respectively. The 4 low order address digits of the faulty byte are thus '1101'. Since the binary value of '1101' is more than '0001', we subtract 16 from '1 0001' and replace the 4 low order digits to get '0 1101' as address for the faulty byte. The decoding of the faulty 'fghj=1011' results in 'FGH=000', instead of '101' as originally transmitted. This will generate violations in VPAR bits F and H, which are used to complement the F and H bits of the byte with address '0 1101'.

Conclusion

The native error detection capability of the partitioned Fibre Channel Standard 8B/10B transmission code enhanced by 8 parity bits derived from disparity patterns can locate an erroneous byte in a frame with very high probability. This error locating technique makes error correction by simple vertical parity possible and is well suited for the Fibre Channel with long frames and can be made transparent to the existing FCS protocol. It is more efficient and more powerful than the error correction proposal rejected by the FCS committee.

APPENDIX

ERROR LOCATING WITH FIBRE CHANNEL TRANSMISSION CODE

To prove the functioning of the error locating scheme using Fibre Channel code, we have to know with what probability a single error in a coded byte escapes immediate detection, and with what probability it escapes detection with each succeeding byte of random data.

We assume an ANSI FCS frame structure which is based on four byte words. A single control character is limited to the first byte of a word. In frames protected by error correction, the control character is present only in the first and last word of the frame. To make recognition of SOF and EOF independent of any single erroneous byte, elements of two consecutive words are used to locate SOF and EOF as described under 'Fibre Channel Start and End of Frame Detection'. We can thus assume, that any control character between SOF and EOF so recognized is an invalid character generated by an error.

Probability of error indication at the erroneous byte

Given a single error in an encoded byte, any individual bit is in error with a probability of 0.1.

6B block (abcdei)

There are 18 disparity independent balanced 6B vectors, one disparity dependent balanced code point (D7), and 13 unbalanced data vectors.

TABLES

TABLE I

Error location with 2 levels of balance bits

| BYTE NAME | RAW DATA ABCDE | FGH | K | DF | CODED BYTES abcdei | fghj | DK | BB 0 | 1 | 2 | 3 | BQ 0 | 1 | 2 | 3 | BYTE # | FRAME |
|---|---|---|---|---|---|---|---|---|---|---|---|---|---|---|---|---|---|
| K28.5 | 00111 | 101 | 1 | − | 001111 | 1010 | + |   |   |   |   |   |   |   |   |        | IDEL0 |
| D21.4 | 10101 | 001 | 0 | + | 101010 | 0010 | − |   |   |   |   |   |   |   |   |        | IDEL1 |
| D21.5 | 10101 | 101 | 0 | − | 101010 | 1010 | − |   |   |   |   |   |   |   |   |        | IDEL2 |
| D21.5 | 10101 | 101 | 0 | − | 101010 | 1010 | − |   |   |   |   |   |   |   |   |        | IDEL3 |
| K28.5 | 00111 | 101 | 1 | − | 001111 | 1010 | + | 0 | — | — | — |   |   |   |   | 0 0000 | SOF0 |
| D21.5 | 10101 | 101 | 0 | + | 101010 | 1010 | + | — | 1 | — | — |   |   |   |   | 0 0001 | SOF1 |
| D23.1 | 11101 | 100 | 0 | + | 000101 | 1001 | − | — | — | 0 | — |   |   |   |   | 0 0010 | SOF2 |
| D23.1 | 11101 | 100 | 0 | − | 111010 | 0110 | + | — | — | — | 0 | 0 | — | — | — | 0 0011 | SOF3 |
| D09.0 | 10010 | 000 | 0 | + | 100101 | 0100 | − | 0 | — | — | — |   |   |   |   | 0 0100 |   |
| D19.6 | 11001 | 011 | 0 | − | 110010 | 0110 | − | — | 1 | — | — |   |   |   |   | 0 0101 |   |
| D27.7 | 11011 | 111 | 0 | − | 110110 | 0001 | − | — | — | 1 | — |   |   |   |   | 0 0110 |   |
| D01.4 | 10000 | 001 | 0 | − | 011101 | 0010 | − | — | — | — | 1 | — | 0 | — | — | 0 0111 |   |
| D00.1 | 00000 | 100 | 0 | − | 100111 | 1001 | + | 0 | — | — | — |   |   |   |   | 0 1000 |   |
| D03.5 | 11000 | 101 | 0 | + | 110001 | 1010 | + | — | 1 | — | — |   |   |   |   | 0 1001 |   |
| D17.6 | 10001 | 011 | 0 | + | 100011 | 0110 | + | — | — | 1 | — |   |   |   |   | 0 1010 |   |
| D28.4 | 00111 | 001 | 0 | + | 001110 | 0010 | − | — | — | — | 0 | — | — | 1 | — | 0 1011 |   |
| D20.2 | 00101 | 010 | 0 | − | 001011 | 0101 | − | 1 | — | — | — |   |   |   |   | 0 1100 |   |
| D06.5 | 01100 | 101 | 0 | − | 011001 | 1010 | − | — | 1 | — | — |   |   |   |   | 0 1101 |   |
| D09.1 | 10010 | 100 | 0 | − | 100101 | 1001 | − | — | — | 1 | — |   |   |   |   | 0 1110 |   |
| D25.5 | 10011 | 101 | 0 | − | 100110 | 1010 | − | — | — | — | 1 | — | — | — | 1 | 0 1111 |   |
| D18.6 | 01001 | 011 | 0 | − | 010011 | 0110 | − | 1 | — | — | — |   |   |   |   | 1 0000 |   |
| D13.0 | 10110 | 000 | 0 | — | 101100 | 1011 | + | — | 0 | — | — |   |   |   |   | 1 0001 |   |
| D11.3 | 11010 | 110 | 0 | + | 110100 | 0011 | + | — | — | 1 | — |   |   |   |   | 1 0010 |   |
| D21.0 | 10101 | 000 | 0 | + | 101010 | 0100 | − | — | — | — | 0 | 1 | — | — | — | 1 0011 |   |
| D14.5 | 01110 | 101 | 0 | − | 011100 | 1010 | − | 1 | — | — | — |   |   |   |   | 1 0100 |   |
| D07.6 | 11100 | 011 | 0 | − | 111000 | 0110 | − | — | 1 | — | — |   |   |   |   | 1 0101 |   |
| D01.7 | 10000 | 111 | 0 | − | 011101 | 0001 | − | — | — | 1 | — |   |   |   |   | 1 0110 |   |
| D17.7 | 10001 | 111 | 0 | − | 100011 | 0111 | + | — | — | — | 0 | — | 0 | — | — | 1 0111 |   |
| K28.5 | 00111 | 101 | 1 | + | 110000 | 0101 | − | 0 | — | — | — |   |   |   |   | 1 1000 | EOF0 |
| D21.5 | 10101 | 101 | 0 | − | 101010 | 1010 | − | — | 1 | — | — |   |   |   |   | 1 1001 | EOF1 |
| D21.6 | 10101 | 011 | 0 | − | 101010 | 0110 | − | — | — | 1 | — |   |   |   |   | 1 1010 | EOF2 |
| D21.6 | 10101 | 011 | 0 | − | 101010 | 0110 | − | — | — | — | 1 | — | — | 0 | — | 1 1011 | EOF3 |
| K28.5 | 00111 | 101 | 1 | − | 001111 | 1010 | + |   |   |   |   |   |   |   |   | 1 1100 | PP0 |
| D11.1 | 11010 | 100 | 0 | + | 110100 | 1001 | + |   |   |   |   |   |   |   |   | 1 1101 | VPAR |
| D06.1 | 01100 | 100 | 0 | + | 011001 | 1001 | + | 0 | 1 | 1 | 0 | 0 | 1 | 0 | 0 | 1 1110 | BPAR |
| D03.4 | 11000 | 001 | 0 | + | 110001 | 0010 | − |   |   |   |   |   |   |   |   | 1 1111 | PP3 |

APPENDIX-continued

ERROR LOCATING WITH FIBRE CHANNEL TRANSMISSION CODE

Balanced 6B code words: Any 6B vector starting with a run length of four is invalid. As explained above, control characters between SOF and EOF are also considered invalid, so any 6B block ending with a run of four located in that area is also invalid. There are 8 balanced vectors which can generate such violations by a change in one particular bit (D3, D12, D13, D14, D17, D18, D19, D28). The probability of an error indication from this source is $$0.1 \cdot (8/32) = 0.025$$

There are 3 code points (D7, D11, D20) which generate the same violations by a change in one of 2 separate bit positions. The probability of an error indication from this source is:

$$0.2 \cdot (3/32) = 0.01875$$

A single error in any of the remaining bit positions of balanced vectors causes a disparity violation in the affected block with a probability of 0.5, e.g. if the running disparity at the start of the block is +1, an erroneous one in a blanced block will lead to a running disparity of +3 at the end of the block, which is a violation. The probability of an error indication from this source is:

$$0.5|0.5 \ (8/32) + 0.4(3/32) + 0.6 \ (19-8-3)/32] = 5/32 = 0.15625$$

In summary, the probability that an error hits a balanced 6B block and is detected is thus:

$$0.025 + 0.01875 + 0.15625 = 0.2$$

Unbalanced 6B code words: If an error hits a 6B block in a random data field, it is an unbalanced code point with a probability of 13/32. A change of value for one of two bit positions of each such vector generates a block disparity of four, which is invalid. The probability of an error indication from this source is:

$$0.2 \ (13/32) = 0.08125$$

An error in one particular position of D0 or D15 generates a balanced D7 (000111 or 111000) vector with an invalid starting disparity, e.g. '+011000' may be changed to '+111000'. The vector '111000' requires a negative starting disparity. The probability of an error indication from this source is:

$$0.1 \ (2/32) = 0.00625$$

The probability that an error hits an unbalanced 6B block and is detected is thus:

$$0.08125 + 0.00625 = 0.0875$$

Error in 6B block detected by 4B block: The portion of 6B errors not instantly detected by the previous rule violations is:

$$0.6 - 0.2 - 0.0875 = 0.3125$$

Any single error, not immediately detected in the 6B block, is detected by the next disparity dependent 4B or 6B block. In the 4B field, 4 out of 8 data points are dependent on the starting disparity. Therefore, the remaining errors escape detection in the same byte with a probability of 0.5. The probability of an error indication from this source is:

$$0.5 \cdot 0.3125 = 0.15625$$

Probability of immediately detected 6B error: The probability that an error hits the 6B block and is detected by the end of the byte is thus:

$$PD6B = 0.2 + 0.0875 + 0.15625 = 0.44375$$

4B block (fghj)
There are 4 disparity independent, balanced 4B vectors, one disparity dependent, balanced (Dx.3), and 3 unbalanced code points. One of the unbalanced points (Dx.7) has an alias dependent on the running disparity and the 6B value.

Balanced 4B code words: An error in any of the five balanced code words creates an immediate disparity violation with a probability of 0.5. The error is in the 4B block with a probability of 0.4. The probability of an error indication from this source is:

$$0.4 \cdot 0.5 \ (5/8) = 0.125$$

Errors in the balanced 4B vectors may also generate Dx.P7 and Dx.A7 vectors, [Widmer, 93], which may violate S function rules for alternate coding. One has to be careful not to double-count detected errors. For this purpose it is useful to list the sets of 4 error vectors which can be generated each from Dx.1, Dx.2, Dx.5, and Dx.6. Each error vector is then examined for violations for either starting disparity. For each of the above source vectors an error in one particular bit position generates with a probability of 0.5 a Dx.P7 vector which does not violate the disparity rules, but may violate S function coding rules with a probability of 29/32. The vector Dx.P7 is correct only if the S function, as defined for the 6B block, is not true. For random data the S function is true with a probability of 3/32. An error in another position can generate with a probability of 0.5 a Dx.A7 vector which meets the disparity rules, but is correct only if S is true, which happens in 3 out of 32 bytes.

An error in a Dx.3 vector generates for either starting disparity in 1 out of 4 cases a vector Dx.A7 which does not violate disparity rules, but may violate the S function rule with a probability of 3/32.

APPENDIX-continued

ERROR LOCATING WITH FIBRE CHANNEL TRANSMISSION CODE

If the S function is true, additional errors are indicated with the following probability:

$$0.1 \ (1/8) \ (3/32) \ (4 \cdot 0.5 + 1) = 0.9/256 = 0.003515625$$

If the S function is not true, additional errors are indicated with the following probability:

$$0.1 \ (1/8) \ (29/32) \ 4 \cdot 0.5 = 2.9/128 = 0.02265625$$

The proportion of errors which occur in balanced 4B vectors and are detected is thus:

$$0.125 + 0.003515625 + 0.02265625 = 0.151171875$$

Unbalanced 4B code words: For the data point Dx.0 = '0100' or its complement, an error in the first or second bit position generates a disparity violation or an invalid code point, respectively. An error in the second half escapes immediate detection.

For the data point Dx.4 = '0010' or its complement, an error in the third bit generates an invalid character, but otherwise errors escape immediate detection.

For the code point Dx.P7 = '1110', or its complement, an error in the last bit generates an invalid code point, otherwise errors are not immediately detected. If the S function is true, an alternate coded vector Dx.A7 = '0111' or its complement is used for the same data point. For the alternate code points, an invalid character or a disparity violation is generated by errors in the first or second bit position, respectively.

The probability that an error hits an unbalanced 4B block and is immediately detected can be calculated as follows:

$$0.2 \ (1/8) + 0.1 \ (1/8) + 0.1 \ (1/8)(29/32) + 0.2 \ (1/8)(3/32) = 13.1/256 = 0.051171875$$

Probability of immediately detected 4B error: The probability that an error hits the 4B block and is detected by the end of the byte is thus:

$$PD4B = 0.151171875 + 0.051171875 = 0.20234375$$

Probability of immediately detected byte error: The probability PD10B that an error in a byte is detected by the end of that byte is the sum of the PD6B and PD4B probabilities:

$$PD10B = PD6B + PD4B = 0.44375 + 0.20234375 = 0.64609375$$

The probability PE10B that an error in a byte escapes instant detection is:

$$PE10B = 1 - 0.64609375 = 0.35390625$$

Probability of an error being missed by succeeding bytes

Errors which escape instant detection will generate a disparity violation at the next disparity dependent 6B or 4B block. The probability that both subblocks of an encoded byte are disparity independent and thus will not flag a previous error is:

$$(18/32) \cdot (4/8) = 9/32 = 0.28125$$

Probability of an error being missed in the first four bytes
The probability PE1W that an error escapes detection in the byte where it occurs and in the next 3 bytes:

$$PE1W = 0.35390625 \cdot 0.28125^3 = 0.7873463631 \cdot 10^{-2}$$

Probability of an error being missed in the first eight bytes
The probability PE2W that an error escapes detection in the byte where it occurs and in the next 7 bytes:

$$PE2W = 0.35390625 \cdot 0.28125^7 = 0.49264712 \cdot 10^{-4}$$

Probability of being missed in the first sixteen bytes
The probability PE4W that an error escapes detection in the byte where it occurs and in the next 15 bytes:

$$PE4W = 0.35390625 \cdot 0.28125^{15} = 0.19287512 \times 10^{-8}$$

I claim:

1. A method for determining whether a current word in a stream of a plurality of frames of words is an idle word, an end-of-frame word, or a start-of-frame word of one of said plurality of frames of words wherein an error can occur in said stream of words, said current word contains four bytes, each of said plurality of frames of words starts with a start-of-frame word and ends with an end-of-frame word, each followed by a modified idle word; between each of said plurality of frames of words there is at least one idle word; each of said end-of-frame word, said start-of-frame word, said modified-idle word and said idle word comprises four bytes, there being a defined start-of-frame word, a defined end-of-frame word, a defined idle word and a defined modified idle word, each of which has four bytes one of said four bytes of each of said defined end-of-frame word, said defined start-of-frame word, said defined idle word, and said defined modified-idle word is a comma character, three of said four bytes of said defined end-of-frame word are a preset end-of-frame subset, three of said four bytes of said defined start of frame word are a preset start-of-frame subset, three of said four bytes of said defined idle word are a preset idle subset; one of said four bytes of said defined modified-idle-word is a preset modified idle subset; said method comprising:

determining if said current word is an idle word, said current word is assumed to be an idle word if three of said four bytes of said current word match three of said four bytes of said defined idle word and if it is followed by a word determined to be a start-of-frame word;

if said current word is not an idle word, determining if said current word is a start-of-frame word, said current word is assumed to be a start-of-frame word if three of said four bytes of said current word match three of said four bytes of said defined start-of-frame word and if a word preceding said current word is an idle word;

if said current word is not a start-of-frame word, determining if said current word is an end-of-frame word, said current word is assumed to be an end-of-frame word if either all of said four bytes of said current word match said four bytes of said defined end-of-frame word and at least one byte of a next word following said current word matches said four bytes of said defined modified-idle word, or if at least three of said four bytes of said current word match said four bytes of said defined end-of-frame word and at least two bytes of said next word match two bytes of said defined modified idle word.

\* \* \* \* \*